(12) United States Patent
Fritz et al.

(10) Patent No.: US 11,953,539 B2
(45) Date of Patent: Apr. 9, 2024

(54) MACHINE OPERATION MONITORING

(71) Applicant: Hitech & Development Wireless Sweden AB, Kista (SE)

(72) Inventors: Örjan Fritz, Kista (SE); Åke Jernberger, Kista (SE); Pär Bergsten, Kista (SE)

(73) Assignee: HITECH & DEVELOPMENT WIRELESS SWEDEN AB, Kista (SE)

( * ) Notice: Subject to any disclaimer, the term of this patent is extended or adjusted under 35 U.S.C. 154(b) by 506 days.

(21) Appl. No.: 17/275,977

(22) PCT Filed: Sep. 16, 2019

(86) PCT No.: PCT/EP2019/074586
§ 371 (c)(1),
(2) Date: Mar. 12, 2021

(87) PCT Pub. No.: WO2020/053435
PCT Pub. Date: Mar. 19, 2020

(65) Prior Publication Data
US 2022/0034957 A1 Feb. 3, 2022

(30) Foreign Application Priority Data
Sep. 14, 2018 (EP) .................................... 18194576

(51) Int. Cl.
*G01R 31/26* (2020.01)
*H02K 11/215* (2016.01)
*H04W 4/029* (2018.01)

(52) U.S. Cl.
CPC ....... *G01R 31/2612* (2013.01); *H02K 11/215* (2016.01); *H04W 4/029* (2018.02)

(58) Field of Classification Search
CPC .......................... G01R 31/2612; H02K 11/215
See application file for complete search history.

(56) References Cited

U.S. PATENT DOCUMENTS

| 9,356,931 B2 | 5/2016 | Ekman et al. |
| 2011/0040495 A1* | 2/2011 | El-Refaie ............. G01M 13/04 |
| | | 702/182 |

(Continued)

FOREIGN PATENT DOCUMENTS

| CN | 102135601 A | 7/2011 |
| CN | 106772635 A | 5/2017 |

(Continued)

OTHER PUBLICATIONS

"A Survey if Indoor Localization System and Technology" by Zafri et al. (Year: 2019).*

(Continued)

*Primary Examiner* — Paresh Patel
(74) *Attorney, Agent, or Firm* — Volpe Koenig

(57) ABSTRACT

An arrangement for monitoring the operation of a machine intended to be tracked by a real-time locating system comprises: a tag intended to be arranged on the machine, the tag being configured to generate a wireless tag signal allowing determination of a position of the tag; and at least one detector intended to be arranged on the machine, the at least one detector being configured to detect at least one characteristic of a magnetic field generated by the machine. Detection of the at least one characteristic is indicative of the machine being operative. The arrangement makes it possible to obtain a detailed understanding of how the machine is used in a cost-effective manner. A real-time locating system comprising such an arrangement and a method for monitoring the operation of a machine are also disclosed.

15 Claims, 6 Drawing Sheets

(56) References Cited

U.S. PATENT DOCUMENTS

| | | | |
|---|---|---|---|
| 2016/0306012 A1* | 10/2016 | Pinto | G01R 33/04 |
| 2019/0244309 A1* | 8/2019 | Ottnad | G06Q 50/04 |
| 2022/0129843 A1* | 4/2022 | Grahn | G01S 5/14 |

FOREIGN PATENT DOCUMENTS

| | | | |
|---|---|---|---|
| EP | 2288000 A2 | 2/2011 | |
| WO | 2012/120302 A1 | 9/2012 | |
| WO | 2015/173662 A1 | 11/2015 | |
| WO | WO-2018073422 A2 * | 4/2018 | B07C 7/005 |

OTHER PUBLICATIONS

International Search Report dated Dec. 20, 2019 for PCT International Application No. PCT/EP2019/074586.

Written Opinion of the International Searching Authority dated Mar. 19, 2020 for PCT International Application No. PCT/EP2019/074586.

* cited by examiner

MACHINE OPERATION MONITORING

TECHNICAL FIELD

The present invention generally relates to machine operation monitoring. Specifically, the present invention relates to an arrangement and a method for monitoring the operation of a machine intended to be tracked by a real-time locating system. The present invention also relates to a real-time locating system comprising such an arrangement.

BACKGROUND

For a variety of reasons, a company may want to monitor the operation of machines that it possesses. Companies in the equipment rental industry, for instance, often have a need to monitor their machines when they are at the customer's locations. Some examples of machines that are often rented include pumps, saw machines, drilling machines, etc., for use at construction sites for buildings and roads. For various reasons, such as certain machines being restricted for use on certain days or the charging rates varying depending on the time of day or day of week, the monitoring should preferably provide information on not only whether or not a particular machine has been used, but also when it was used. Prior art monitoring systems usually do not provide such detailed information, or provide it in a way that is amenable to improvement.

SUMMARY

An objective of the present invention is to provide an improved or alternative solution for monitoring the operation of a machine.

According to a first aspect of the present invention, there is presented an arrangement for monitoring the operation of a machine intended to be tracked by a real-time locating system, wherein the arrangement comprises: a tag intended to be arranged on the machine, wherein the tag is configured to generate a wireless tag signal allowing determination of a position of the tag; and at least one detector intended to be arranged on the machine, wherein the at least one detector is configured to detect at least one characteristic of a magnetic field generated by the machine, and wherein detection of the at least one characteristic is indicative of the machine being operative.

The arrangement according to the first aspect of the present invention makes it possible to obtain information on whether a machine is operative or inoperative at a particular point in time. The machine is herein considered to be operative after having been turned on and is being used for its intended purpose. The machine may also be considered operative after it has been turned on and is idling.

The present invention is based on the realization that many machines generates an easy-to-detect magnetic field when operative and that a real-time locating system can advantageously be used also for monitoring the operation of machines. Having one and the same system providing data regarding the location as well as the operation of the machine makes it possible to obtain an accurate and detailed understanding of how the machine is used, such as whether the machine is used at a time and place where it should not be used because of safety or some other reason. Further, as the present invention does not require extensive modifications to the real-time locating system, its implementation can be particularly simple and cost-effective.

It should be noted that the detected at least one characteristic may, in some applications, allow for not only information regarding whether or not the machine is operative to be obtained, but also other details related to the operation of the machine, such as power consumption, a number of revolutions per time unit performed by the machine, etc.

The machine can be virtually any machine that generates a magnetic field during operation. Examples of such machines include machines having an electric motor and/or a combustion engine, in particular a combustion engine having an ignition coil.

The at least one detector may be integrated with the tag. In such case, the detector and the tag typically have fixed positions relative to each other and are typically arranged inside the same housing. Alternatively, the at least one detector may be separate from the tag. In such case, the detector and the tag are not fixed, but movable, relative to each other. By using a detector that is separate from the tag, the positions of both of these components on the machine can be optimized.

The detector may be configured to provide the tag with a result of a detection performed by the detector. In such case, the wireless tag signal may be indicative of the result. It is noted that the detector may be configured to provide the tag with the result of a detection in various ways. For example, the detector may be configured to transmit, either by a wired connection or a wireless connection, the result to the tag. As another example, the detector may be configured to make the result accessible to the tag by storing the result in a memory unit from which the result can be retrieved by the tag.

The detector may be configured to provide an external device with a result of a detection performed by the detector. The external device may for example be an anchor point included in a real-time locating system. The detector is typically configured to provide such an anchor point with the result by wirelessly transmitting the result to the anchor point.

The at least one detector may be configured to detect the at least one characteristic according to a predetermined schedule. The predetermined schedule determines how often the detector should detect for the at least one characteristic. For example, if the machine is expected to be turned on and off relatively often, the detector is usually configured to detect for the characteristic relatively frequently. If, on the other hand, the machine is expected to be running for a long time once started, it may be sufficient that the detector detects for the characteristic relatively infrequently.

The at least one characteristic can be virtually any characteristic of the magnetic field which indicates that the machine is operative. Which characteristic is suitable for a particular application typically depends on various factors, such as the machine type. In some applications, it may suffice to detect whether or not a magnetic field is present in order to determine whether or not the machine is operative. In such case, the at least one characteristic may be a characteristic indicative of the presence of a magnetic field. As another example, the at least one characteristic may be related to one of an amplitude of the magnetic field and a frequency of the magnetic field. As yet another example, if the machine is configured to be powered by an input current, the at least one characteristic may be related to a property of the input current.

The arrangement may comprise at least one of an accelerometer configured to detect vibrations of the machine and a thermometer configured to detect a temperature of the machine. The accelerometer and/or the thermometer may for example be integrated with the tag. The accelerometer data and/or thermometer data may be used to improve the accuracy of the monitoring of the operation of the machine.

According to a second aspect of the present invention, there is presented a real-time locating system comprising: at least one arrangement according to the first aspect of the present invention; and a server configured to receive a result of a detection performed by the detector and to determine whether the machine is operative or inoperative based on the received result.

It will be appreciated that the real-time locating system according to the second aspect of the present invention may provide for technical effects that are largely analogous to those of the arrangement according to the first aspect of the invention.

The server may be configured to receive the wireless tag signal. This makes the real-time positioning system particularly suitable for monitoring the operation of machines that are not expected to be used within a predetermined zone, such as machines that need to be transported between several different construction sites for buildings and roads.

The real-time locating system may comprise several anchor points intended to be arranged at respective fixed positions, wherein each anchor point is configured to receive the wireless tag signal and to generate a wireless anchor signal based on the received tag signal, and wherein the server is configured to receive the wireless anchor signal. Such a real-time positioning system is particularly suitable for monitoring the operation of machines that are expected to be used within a predetermined zone, such as on the premises of a building.

The anchor points may be configured to generate the wireless anchor signals upon receiving a request from the server. Thereby, the power consumption of the anchor points may be reduced. It is noted, however, that the anchor points may be configured to automatically, for example periodically, generate wireless anchor signals, so that the server does not have to send a request.

The server may be configured to transmit a wireless server signal to an external display device, wherein the wireless server signal is indicative of the result. The display device may be configured to visualize the information received from the server to a user.

According to a third aspect of the present invention, there is presented a method for monitoring the operation of a machine intended to be tracked by a real-time locating system, wherein the method comprises the steps of: arranging a tag on the machine; arranging at least one detector on the machine; generating, by the tag, a wireless tag signal allowing determination of a position of the tag; and detecting, by the detector, at least one characteristic of a magnetic field generated by the machine, wherein detection of the at least one characteristic is indicative of the machine being operative.

It will be appreciated that the method according to the third aspect of the present invention may provide technical effects that are largely analogous to those of the arrangement according to the first aspect of the invention and the real-time locating system according to the second aspect of the present invention.

The method may comprise the step of providing the tag with a result of said step of detecting at least one characteristic, wherein the wireless tag signal is indicative of said result. Further, the method may comprise the steps of: receiving, by a server of the real-time locating system, a result of a detection performed by the detector; and determining, by the server, whether or not the machine is operative or inoperative based on the received result. Still further, the method may comprise the step of visualizing, by a display device, the result of a detection performed by the detector.

BRIEF DESCRIPTION OF THE DRAWINGS

The present invention will be described in more detail with reference to the appended drawings which show examples of embodiments of the present invention.

FIGS. 5A, 5B, 5C, 5D, 5E, 5F, 5G, 5H, 5I, respectively, show the magnetic field strength for different frequencies of use.

DETAILED DESCRIPTION

The present invention will be described more fully hereinafter with reference to the accompanying drawings showing embodiments of the invention. The present invention may, however, be embodied in many different forms and should not be construed as limited to the embodiments set forth herein. Rather, these embodiments are provided for thoroughness and completeness, and fully convey the scope of the invention to a person skilled in the art.

Figure 1:
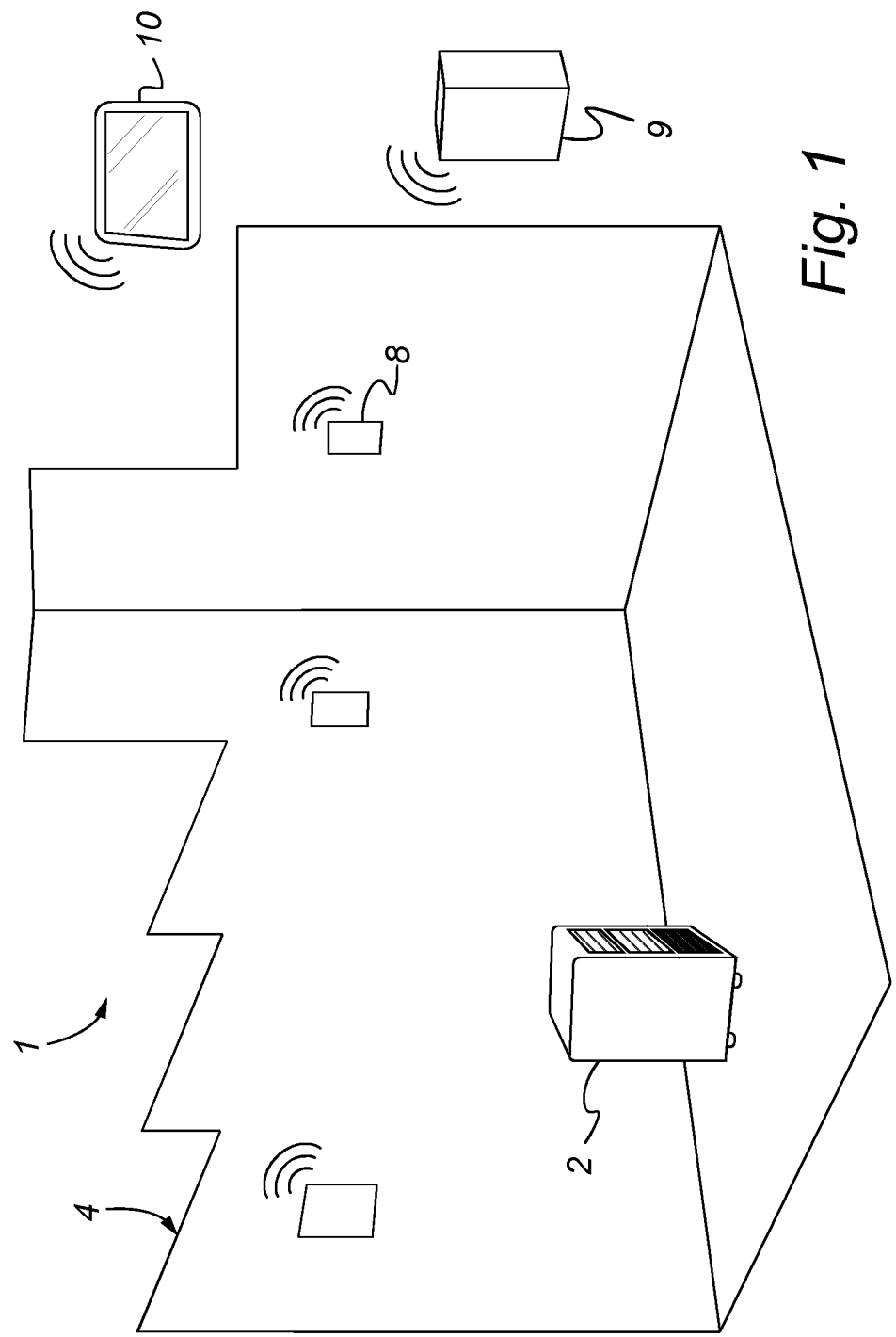
FIGS. 1 and 2 illustrate schematically a real-time locating system according to an embodiment of the invention.
Figure 2:
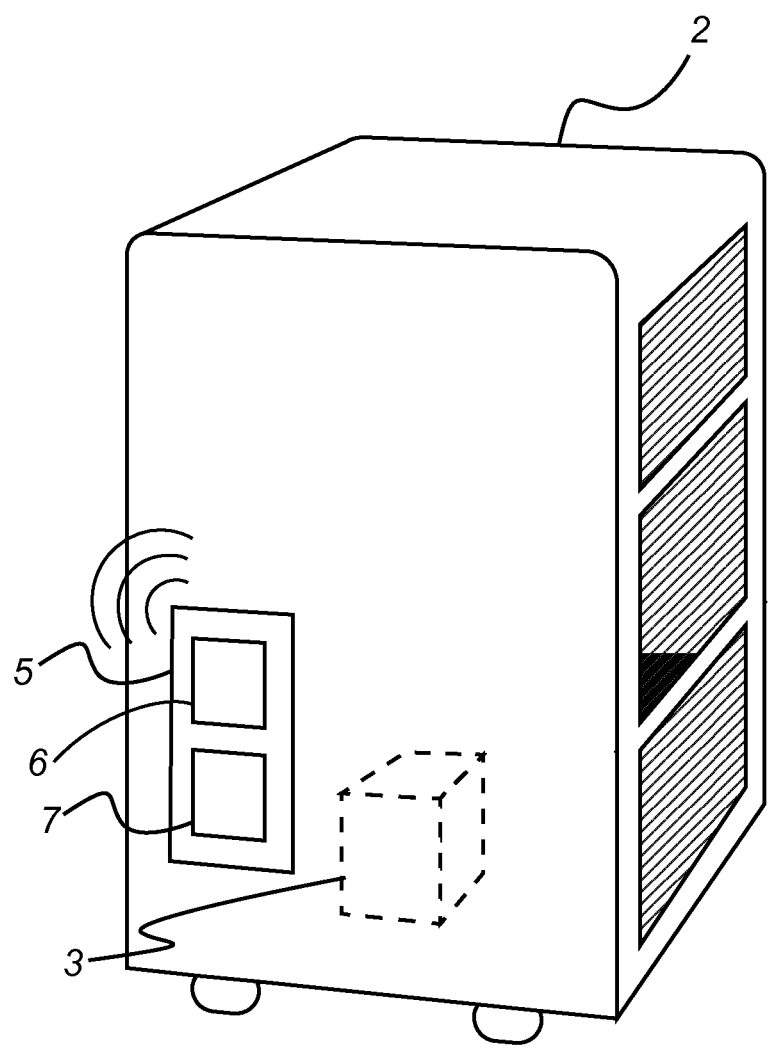

With reference to FIGS. 1 and 2, an example of a real-time locating system (RTLS) 1 will now be described. The RTLS 1 is configured to track a machine 2 and to monitor the operation of the machine 2. The machine 2 is in this case a portable dehumidifier which comprises an electric motor 3 powered by the mains electricity supply. The RTLS 1 is in this case configured to track and monitor the machine 2 within a predetermined zone, here the premises of a building 4. The building 4 is in this case the building of a factory.

It is noted that the RTLS 1 may in a different example be configured to track and monitor not just one but several machines. The RTLS 1 may also be configured to track the location of various objects, such as returnable transport packages, without monitoring the operation thereof. Further, in a different example, the machine 2 may be some other type of machine than a dehumidifier. In fact, the RTLS 1 can monitor the activity of virtually any machine 2 that generates a magnetic field during operation, such as a machine having an electric motor, as in the present example, or a combustion engine. Sawing machines, drilling machines, cutting machines, air compressors, pumps and fans are some examples of machines that typically generate a magnetic field during use and which, therefore, can be monitored by the RTLS 1.

The RTLS 1 comprises a tag 5, or a mobile node, which is attached to the machine 2. The tag 5 may for example be attached to the machine 2 by mechanical means, such as pins or clamps, or by chemical means, such as glue or some other adhesive. The tag 5 is here attached to an outer side of the machine's 2 housing, but the tag 5 may of course be arranged elsewhere on the machine 2 in a different example, such as inside the machine's 2 housing. The tag 5 here comprises a power source in the form of a battery (not shown).

The tag 5 may be referred to as a type of wireless device, since the tag 5 is configured to generate wireless signals. The wireless signals generated by the tag 5 are herein referred to as wireless tag signals or simply tag signals. As will be discussed further below, the tag signals allow, inter alia, the position of the tag 5 to be determined. The tag 5 is in this example configured to repeatedly send out a tag signal. Specifically, the tag signals are here sent out periodically by the tag 5. The frequency with which the tag 5 sends out tag signals depends on application-specific requirements. The higher the frequency, the better the precision with which the RTLS 1 can determine the positions of the tag 5. However, the power consumption of the tag 5 typically increases with the frequency. The tag 5 is usually configured to send out a tag signal approximately every second. It should be noted that, in another example, the tag 5 may, instead of, or in addition to, being configured to repeatedly send out tag signals, be configured to send a tag signal to upon receiving a request from an external device (such as the anchors 8 discussed below).

The tag signals are in this example ultra-wideband signals. However, the tag signals may be some other type of wireless signals in a different example, such as Bluetooth signals, Bluetooth low energy signals or Wi-Fi signals. Which wireless technology is chosen for a particular application depends on various factors, such as how much power the tag 5 should consume and how precisely the RTLS 1 should the able to locate the machine 2.

The RTLS 1 further comprises a detector 6 which in this case is integrated with the tag 5. The detector 6 is a magnetic sensor, such as a MEMS magnetic field sensor. Further, the detector 6 here comprises a timer (not shown) for time keeping and a power source in the form of a battery (not shown). The detector 6 is here configured to repeatedly detect for the presence of a magnetic field having a predetermined frequency. The predetermined frequency is an example of what is herein referred to as a characteristic of the magnetic field generated by the electric motor 3. The characteristic of the generated magnetic field may alternatively be referred to as an engine signature. The predetermined frequency is in this case equal to the frequency of the mains electricity supply. In many countries the frequency of the mains electricity supply is 50 Hz or 60 Hz. It should be noted that, in a different example, the detector 6 may be configured to detect another characteristic, such as an amplitude, of the magnetic field generated by the machine that is being monitored.

The detector 6 is usually configured to perform the detection according to a predetermined schedule. The detector 6 may for example be configured perform the detection once every couple of seconds, once every hour or couple of hours, or once a day. How often the detector 6 is configured to perform the detection depends on, for example, how often the machine 2 is expected to be running and for how long the machine 2 typically is running after having been started. The more often the detector 6 performs the detection, the more precise information on when the machine 2 is running may be obtained. However, the power consumption of the detector 6 typically increases the more often the detector 6 performs the detection.

The detector 6 is usually programmable, so that a user can configure the detector 6 with the predetermined schedule and the magnetic field characteristic to be detected. The detector 6 may be programmable via a wired connection, such as a serial port connection, or a wireless connection, such as a near-field communication connection, a Bluetooth connection, a Bluetooth low energy connection or a Wi-Fi connection. The detector 6 may be programmable by a component of the RTLS 1, such as the server 9 (further discussed below), and/or by an external device, such as a laptop computer, a tablet computer and/or a mobile phone.

The detector 6 and the tag 5 may be referred to as an arrangement for monitoring the operation of the machine 2. In this case, this arrangement further comprises a memory unit 7. The detector 6 is here configured to store the results of the detections in the memory unit 7. The tag 5 is in this case configured to retrieve information stored in the memory unit 7 and to include the retrieved information in the tag signals. It is noted that the arrangement may be configured such that an external device, such as a laptop computer, a tablet computer and a mobile phone, can retrieve the information stored in the memory unit 7, either via an output, such as a serial port, or via a wireless connection, such as Bluetooth connection or a near-field communication connection. The data stored in the memory unit 7 may include not only data from the detector 6, but also other types of data. For example, in some applications the arrangement may include a thermometer and/or an accelerometer. In such case, accelerometer data and temperature data may be stored in the memory unit 7.

The RTLS 1 in this case comprises several anchor points 8, henceforth referred to as anchors for brevity, configured to receive the tag signals emitted by the tag 5. Thus, the anchors 8 may be referred to as a type of wireless devices. The anchors 8 are also configured to generate wireless signals, which herein are referred to as wireless anchor signals or simply anchor signals. The anchor signals are in this case Wi-Fi signals, although the anchor signals can be some other type of wireless signal in a different example, such as GSM signals or LTE signals.

The anchors 8 are here arranged at fixed positions inside the factory 2, and may be referred to as fixed nodes. Specifically, the anchors 8 are in this case arranged on the walls of the factory 2, although the anchors 8 may be arranged elsewhere, such as on the ceiling, in a different example. The anchors 8 are in this case positioned approximately 15 meters to 20 meters from each other.

The RTLS 1 further comprises a server 9 configured to receive the anchor signals. The server 9 is in this case arranged remotely from the factory 2. However, in a different example, the server 9 may be arranged locally, such as inside the factory 2. The server 9 is here configured to communicate wirelessly with anchors 8, in this case via a Wi-Fi network. However, the server 9 and the anchors 8 may in a different example be configured to communicate via some other type of network, such as a GSM network or an LTE network. The communication between the anchors 8 and the server 9 may be secured, for example in the manner described in U.S. Pat. No. 9,356,931 issued to the present applicant. The server 9 is typically communication technology agnostic, i.e. compatible with different ways of accessing a TCP/IP backbone network. The server 9 may be configured to access a TCP/IP backbone network via a wireless connection and/or via a wired connection.

The server 9 is here configured to determine, based on the information in the anchor signals, where the machine 2 is located and whether or not the machine 2 is operative. The server 9 may be configured to determine, based on the information in the anchor signals, further details about the operation of the machine 2, such as the power consumption of the machine 2 and a number of revolutions per minute performed by the machine 2. Still further, the server 9 may be configured to evaluate the information in the anchor signals according to a set of rules and to perform an action based on the evaluation. For example, the server 9 may be configured to send an alarm signal to an operator if the machine 2 enters a certain zone and/or if the machine 2 has been active during a time when it should not have been active.

The server 9 is in this case configured for wireless communication with an external display device 10, such as a desktop computer, a laptop computer, a tablet computer or a mobile phone. Thus, the server 9 is here configured to send wireless signals to the external display device 10. A wireless signal sent by the server 9 to the external display device 10 is herein referred to as a wireless server signal. The display device 10 can visualize, for example, where the machine 2 is located at different times and whether or not the machine 2 is operative at different times. The server 9 and the display device 10 may for example be configured to communicate via a Wi-Fi network, a GSM network or an LTE network.

In use, the RTLS 1 in this case operates in the following manner. The detector 6 repeatedly detects whether or not the machine 2 is operative. Specifically, the detector 6 repeatedly detects for the presence of a magnetic field having the predetermined frequency. The presence of such a magnetic field indicates that the electric motor 3 is running, i.e. that the machine 2 is operative. The absence of such a magnetic field indicates that the electric motor 3 is not running, i.e. that the machine 2 is inoperative. The detector 6 stores the detection results in the memory unit 7, from which they can be retrieved by the tag 5. In this case each detection result comprises (i) an indication of whether or not the machine is operative and (ii) the date and time when detection was made.

The tag 5 repeatedly sends out tag signals which are received by the anchors 8. Each tag signal here comprises sequence data which is data indicating the position of the tag signal in the sequence of tag signals sent out by the tag 5. If the detector 6 has performed a new detection since the last tag signal was sent, the tag 5 includes the result from a detection in the new tag signal. Specifically, in this case, the tag 5 checks to see if a new result has been stored in the memory unit 7 and, if so, includes the new result in the tag signal.

It should be noted that the tag signals may, in a different example, comprise additional data. For example, the tag signals may comprise tag identity information identifying the tag from which the tag signal was sent. Such tag identity information is typically included if the RTLS 1 tracks and monitors several machines 2, each of which has its own tag. As another example, if the tag 5 comprises thermometer and/or accelerometer, the tag signals may include temperature information and/or accelerometer information.

The anchors 8 receive the tag signals emitted by the tag 5. It should be noted that every anchor 8 does not necessarily receive every tag signal 5, for example because too long a distance between the machine 2 and one of the anchors 8. In this case, when an anchor 8 receives a tag signal, the anchor 8 stores the information included therein. Then, when receiving a request from the server 8, the anchor 8 sends out an anchor signal with the stored information together with some additional data, such as the times when the tag signals were received according to the anchor 8. Hence, the amount of information included in an anchor signal sent by an anchor 8 here depends on how many tag signals that anchor 8 has received between the sending of the latest anchor signal and the receiving of a new request from the server 8.

The anchors 8 may be configured to not include some of the information they have stored, such as information that is deemed too old.

The server 9 here uses the information in the anchor signals to determine the position of the tag 5, and thereby also of the machine 2, at different points in time. In this case the server 9 uses a Time Difference of Arrival method to determine the position of the tag 5. The server 9 also uses the information in the anchor signals to determine whether or not the machine 2 is operative at different times. The information regarding the positions of the machine 2 and the activity of the machine 2 is then sent to the display device 10 and presented visually to a user.

Figure 3:
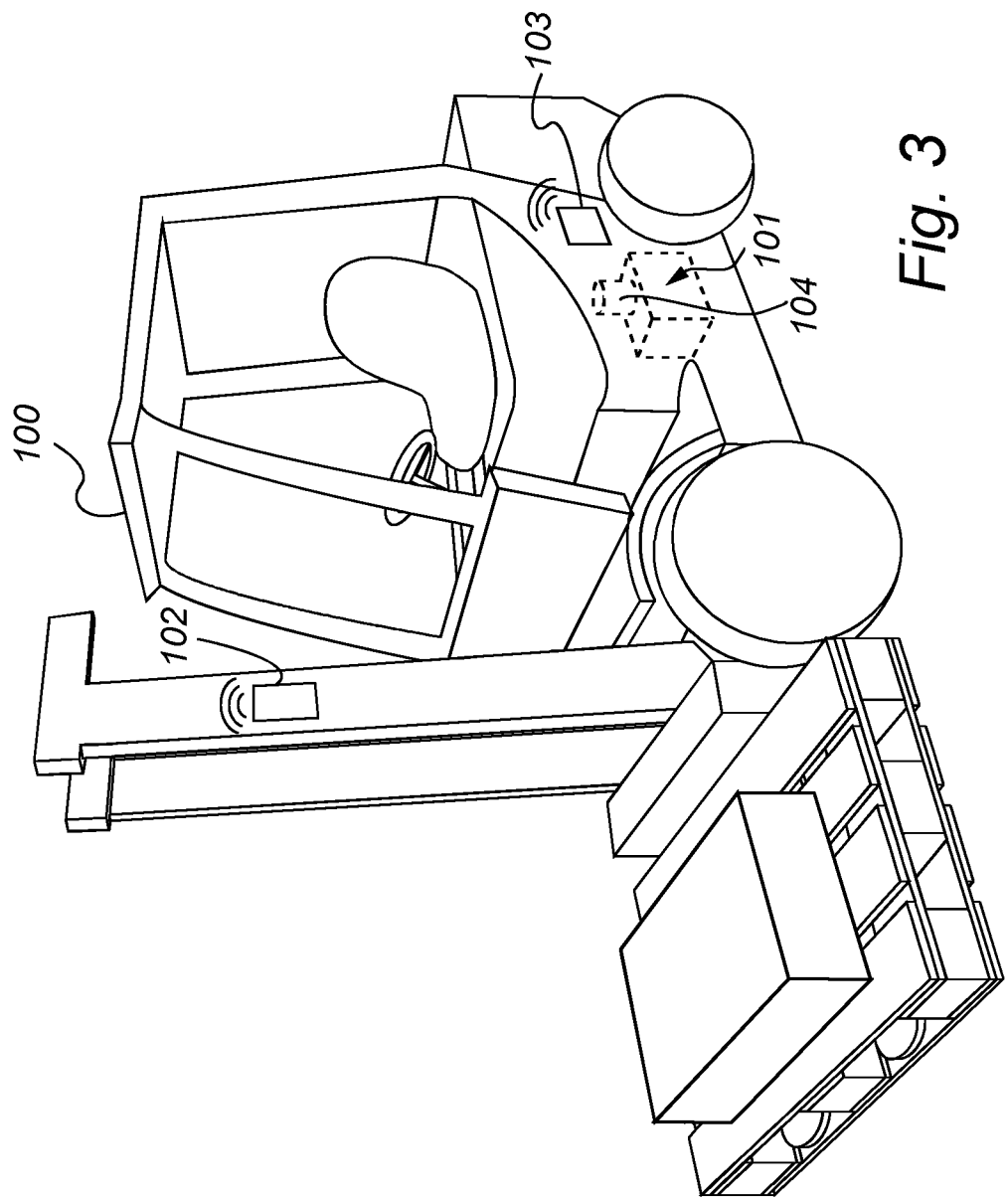
FIG. 3 illustrates schematically a machine provided with an arrangement for monitoring the operation of the machine according to an embodiment of the invention.

FIG. 3 shows an arrangement for monitoring the operation of a machine 100 which, in this case, is a forklift driven by a combustion engine 101. The arrangement may for example be included in the RTLS 1 described above with reference to FIGS. 1 and 2.

The arrangement comprises a tag 102 and a detector 103. The detector 103 is configured to detect a characteristic of a magnetic field generated by the combustion engine 101, more precisely by an ignition coil 104 of the combustion engine 101. The tag 102 and the detector 103 in FIG. 3 are largely similar to the tag 5 and the detector 6 described above with reference to FIGS. 1 and 2. Some of the differences are explained in the following two paragraphs.

The detector 103 is in this case separate from the tag 102, i.e. the detector 103 is not integrated with the tag 102. As can be seen in FIG. 3, the tag 102 and the detector 103 are arranged at different positions on the machine 100, the detector 103 being arranged closer to the combustion engine 101 than the tag 102. The detector 103 is arranged close to the combustion engine 101 in order to detect the magnetic fields generated by the combustion engine 103 more easily.

The detector 103 is in this case configured to communicate wirelessly with the anchors of the RTLS in which the detector 103 is included. Thereby, the detector 103 can send the detection results to the anchors directly. The detector 103 may be configured to send the detection results automatically to the anchors and/or upon receiving a request from the anchors. When sending detection results to the anchors, the detector 103 may include additional information, such as detector identity information allowing the detector 103 to be identified.

As regards the tag 102, it is noted that the tag 102 may for example be configured to communicate with the anchors in a manner described in the present applicant's co-pending application entitled "Carrier utilization tracking", the entire disclosure of which is incorporated herein by reference.

Figure 4:
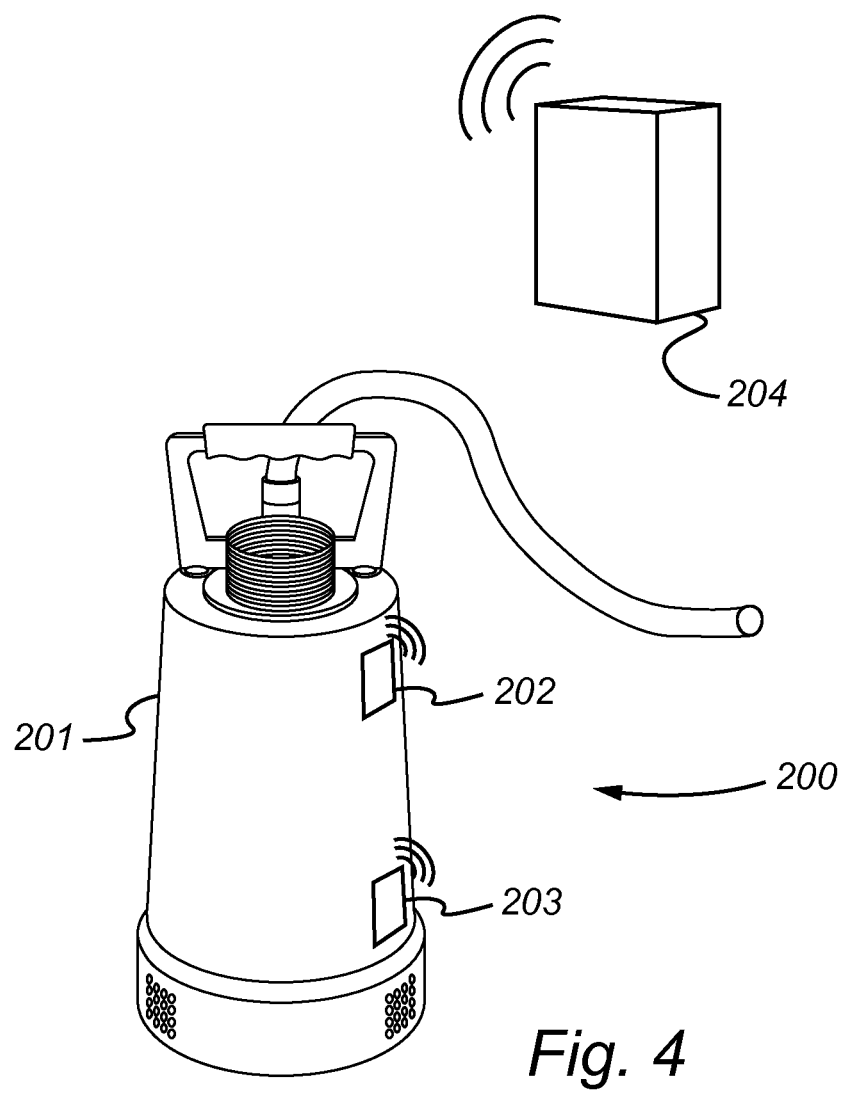
FIG. 4 illustrates schematically a real-time locating system according to an embodiment of the invention.

FIG. 4 shows an example of an RTLS 200 arranged to track the location of a machine 201 and to monitor the operation thereof. The machine 201 illustrated in FIG. 4 is a portable electric pump. The RTLS 200 comprises an arrangement which includes a tag 202 and a detector 203, both of which are arranged on the machine 201. The detector 203 is in this case not integrated with the tag 202. The tag 202 and the detector 203 are arranged at spaced-apart locations on the machine 201.

The detector 203 operates in a similar manner as the detector 6 of the RTLS 1 in FIGS. 1 and 2 and is configured provide the tag 202 with the same information as that detector 6. However, the detector 203 in FIG. 4 sends the information to the tag 202 wirelessly. Thus, the tag 202 and the detector 203 are in this case configured to communicate wirelessly with each other, for example using Bluetooth, Bluetooth low energy or near-field communication.

Unlike the RTLS 1 discussed above with reference to FIGS. 1 and 2, the RTLS 200 does not have any anchors with which the tags 202 communicate. Instead, the tags 202 are in this case configured to send the tag signals directly to the server 204 of the RTLS 200. Thus, the tags 202 and the server 204 are here configured to communicate wirelessly with each other. The tags 202 and the server 204 may for example be configured to communicate over a cellular network, such as a GSM network or an LTE network.

Further, unlike the tags 5 of the RTLS 1 discussed above with reference to FIGS. 1 and 2, the tag 202 in FIG. 4 is capable of determining its own position. Specifically, the 202 is in this case configured to determine its coordinates using a Global Positioning System (GPS). The tag 202 communicates its position, together with information received from the detector 203, to the server 204. The server 204 may then process and use the received data in a similar manner to the server 9 of the RTLS 1 in FIGS. 1 and 2.

FIG. 5a illustrates test results obtained from testing conducted with a detector (magnetic sensor) on an industrial fan at a frequency of use of 0 Hz.

FIG. 5b illustrates test results obtained from testing conducted with a detector (magnetic sensor) on an industrial fan in a frequency of use of 3 Hz.

FIG. 5c illustrates test results obtained from testing conducted with a detector (magnetic sensor) on an industrial fan in a frequency of use of 10 Hz.

FIGS. 5d to h illustrates test results obtained from testing conducted with a detector (magnetic sensor) on an industrial fan in a frequency of use of 20, 30, 40, 50 and 55 Hz, respectively.

Figure 6:
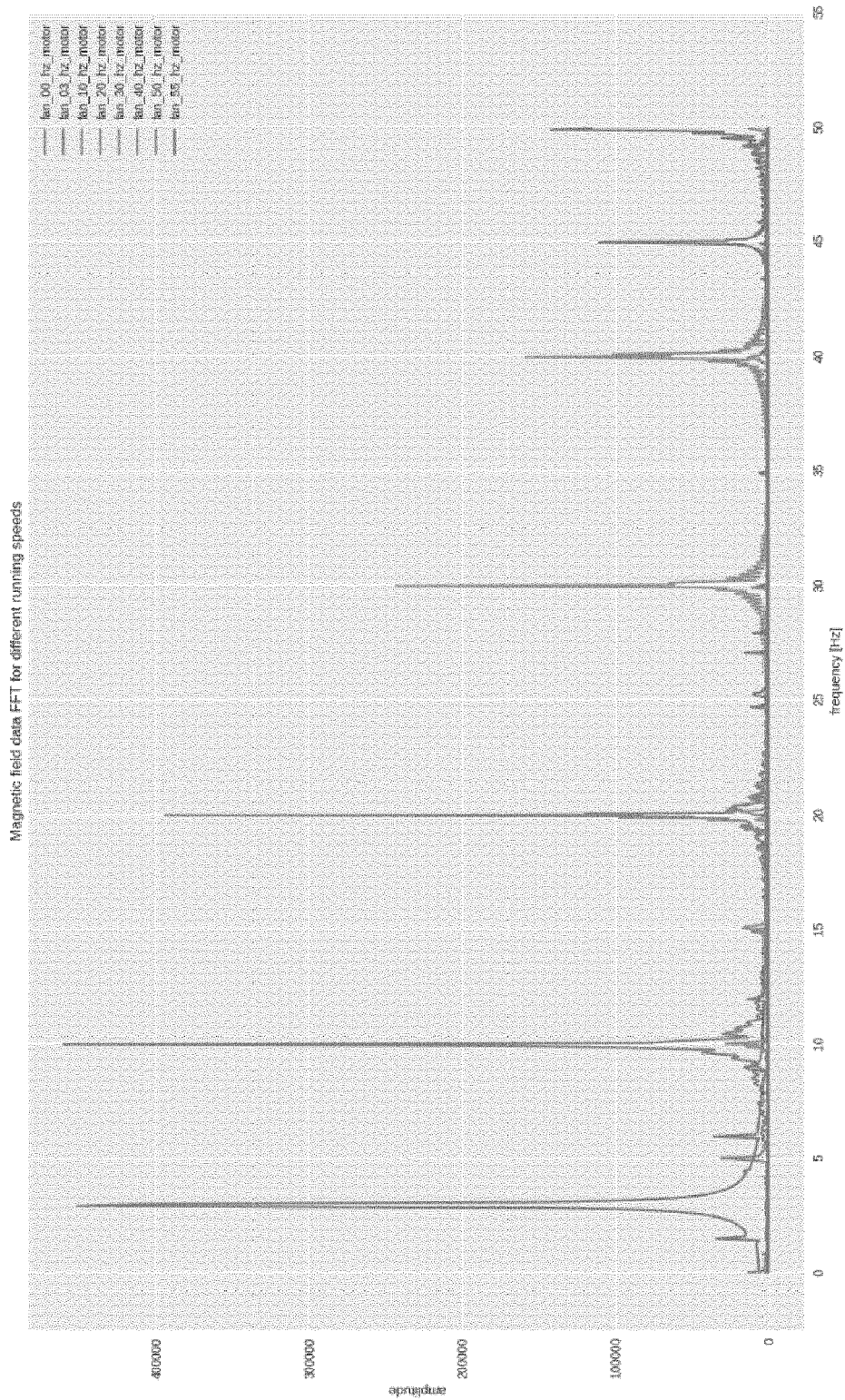
FIG. 6 illustrates test results obtained from testing conducted with a detector (magnetic sensor) on an industrial fan at diverse frequency of use on which an FTT has been performed. Magnetic field amplitudes for different frequencies are shown.

FIG. 6 illustrates test results obtained from testing conducted with a detector (magnetic sensor) on an industrial fan at diverse frequency of use on which a Fast Fourier Transform (FTT) has been performed.

Figure 5:
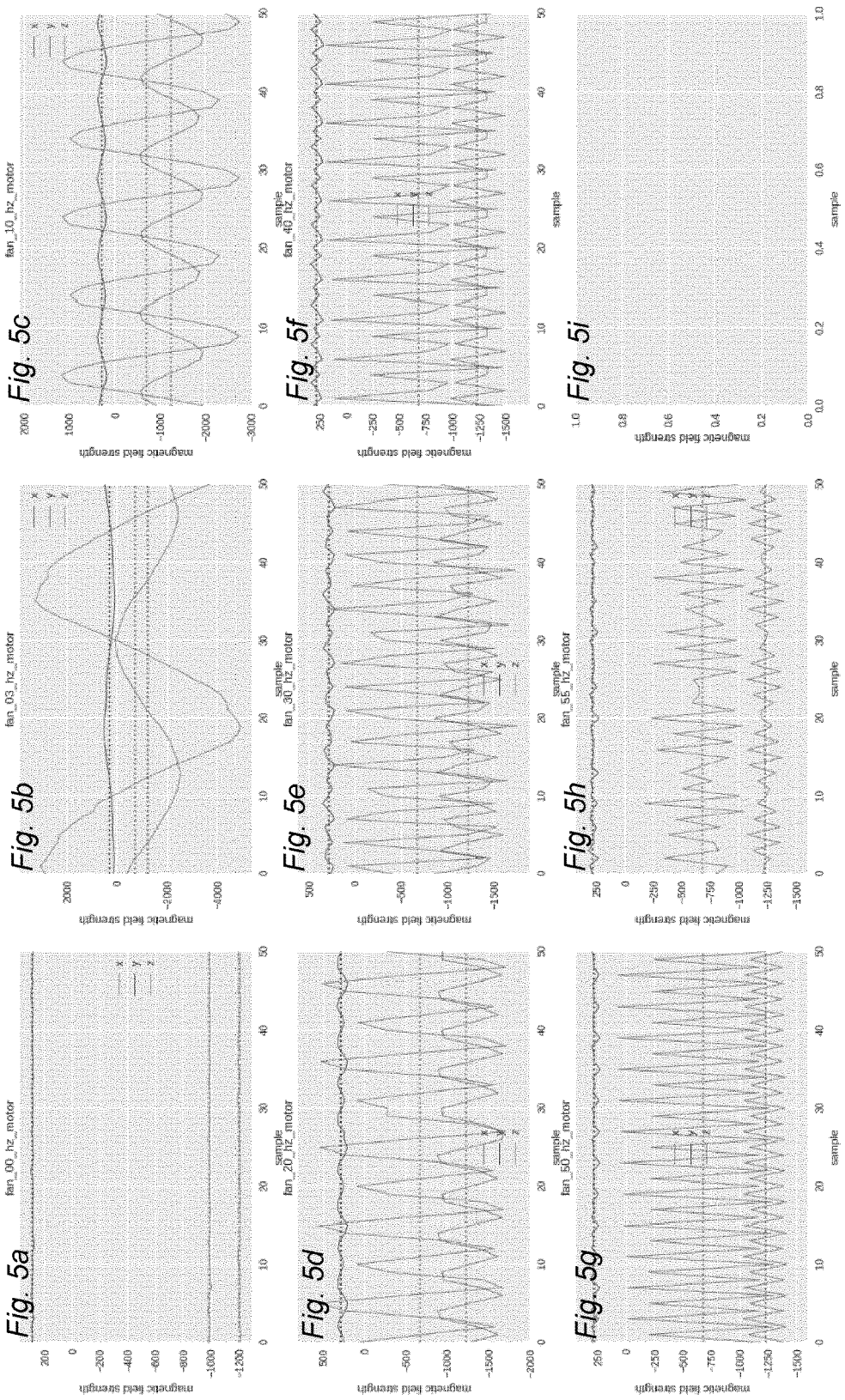
FIG. 5 illustrates test results obtained from testing conducted with a detector (magnetic sensor) on an industrial fan at diverse frequency of use.

Further, FIGS. 5a to 5c and 6 illustrates results obtained during testing of a magnetic sensor (detector) on an industrial fan. The magnetic sensor was placed onto the fan motor and reported the sensor data via Bluetooth connection. The magnetic field was detected in three orthogonal axis x, y, and z which are shown in FIGS. 5a to 5c in which the rotation speed of the fan can indirectly be detected by the changes in the magnetic field for a frequency of operation of 0 Hz, 3 Hz and 10 Hz respectively. FIG. 6 represents the data of FIG. 5 on which a Fast Fourier Transform (FFT) has been performed to illustrate even more clearly at what speed the fan is running. This shows that not only can the on/off state of the fan be followed by the tag, but also the rotation speed said fan is being used at.

The person skilled in the art realizes that the present invention by no means is limited to the embodiments described above. On the contrary, many modifications and variations are possible within the scope of the appended claims. For example, the embodiment in FIGS. 1 and 2 may be combined with the embodiment in FIG. 4, so that the tracked object can be tracked both within a predetermined zone, i.e. when the anchors are within range to receive the signals emitted from the object, and outside of the predetermined zone, i.e. when the anchors are out of range to receive those signals. The transition from the anchors receiving the tag signal to the server receiving the tag signal, and vice versa, may include a handover process.

Accordingly, the present invention may be used in many different scenarios and applications, such as for detecting use of a machine, i.e. how much it has been use (how many hours) and when it has been used (at what time) and to log that information. Such detections and monitoring may be performed using a sensor. It is also possible to detect the characteristics of the use, such as the behavior of the machine, the intensity or speed it is used at, for example how many revolutions per minute, rpm, that is used. The characteristics may also be if the machine behaves normally or abnormally, where an abnormal behavior could indicate an upcoming malfunction of the machine. Machine learning, for example, may be used to train a sensor to detect normal and abnormal behavior. In a further application the data from the sensor comprising the use and characteristics of use could be used as input data in an analysis algorithm for supporting predictions related to preventive maintenance services. Accordingly, the present disclosure provides for a possibility to prevent and predict machine malfunctioning and service need, instead of only detecting a malfunction that has already occurred. Further, it may provide decision support when to perform service or checkups, taking into account an actual use or actual performance of the machine, instead of a general estimation based on the elapsed time.

In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements.

The invention claimed is:

1. An arrangement for monitoring the operation of a machine intended to be tracked by a real-time locating system, wherein the arrangement comprises:
   a tag intended to be arranged on the machine, wherein the tag is configured to generate a wireless tag signal allowing determination of a position of the tag; and
   at least one detector intended to be arranged on the machine, wherein the at least one detector is configured to detect at least one characteristic of a magnetic field generated by the machine, wherein detection of the at least one characteristic is indicative of the machine being operative, and
   wherein the at least one detector is configured to provide the tag with a result of a detection performed by the at least one detector.

2. The arrangement according to claim 1, wherein the at least one detector is integrated with the tag.

3. The arrangement according to claim 1, wherein the at least one detector is separate from the tag.

4. The arrangement according to claim 1, wherein the detector is configured to provide the tag with a result of a detection performed by the detector.

5. The arrangement according to claim 4, wherein the wireless tag signal is indicative of said result.

6. The arrangement according to claim 1, wherein the detector is configured to provide an external device with a result of a detection performed by the detector.

7. The arrangement according to claim 1, wherein the at least one detector is configured to detect the at least one characteristic according to a predetermined schedule.

8. The arrangement according to claim 1, wherein the at least one characteristic is related to one of an amplitude of the magnetic field and a frequency of the magnetic field.

9. The arrangement according to claim 1, wherein the machine is configured to be powered by an input current, and wherein the at least one characteristic is related to a property of the input current.

10. A real-time locating system comprising:
    at least one arrangement according to claim 1; and a server configured to receive a result of a detection performed by the detector and to determine whether the machine is operative or inoperative based on the received result.

11. The real-time locating system according to claim 10, wherein the server is configured to receive the wireless tag signal.

12. The real-time locating system according to claim 10, comprising several anchor points intended to be arranged at respective fixed positions,
- wherein each anchor point is configured to receive the wireless tag signal and to generate a wireless anchor signal based on the received tag signal, and
- wherein the server is configured to receive the wireless anchor signal.

13. The real-time locating system according to claim 10, wherein the server is configured to transmit a wireless server signal to an external display device, wherein the wireless server signal is indicative of said result.

14. A method for monitoring the operation of a machine intended to be tracked by a real-time locating system, wherein the method comprises the steps of:
- arranging a tag on the machine;
- arranging at least one detector on the machine;
- generating, by the tag, a wireless tag signal allowing determination of a position of the tag; and
- detecting, by the detector, at least one characteristic of a magnetic field generated by the machine, wherein detection of the at least one characteristic is indicative of the machine being operative,
- wherein the at least one detector is configured to provide the tag with a result of a detection performed by the at least one detector.

15. The method according to claim 14, comprising the step of providing the tag with a result of said step of detecting at least one characteristic, wherein the wireless tag signal is indicative of said result.

* * * * *